(12) United States Patent
Wicker et al.

(10) Patent No.: US 10,748,867 B2
(45) Date of Patent: Aug. 18, 2020

(54) EXTRUSION-BASED ADDITIVE MANUFACTURING SYSTEM FOR 3D STRUCTURAL ELECTRONIC, ELECTROMAGNETIC AND ELECTROMECHANICAL COMPONENTS/DEVICES

(75) Inventors: Ryan B. Wicker, El Paso, TX (US); Eric MacDonald, El Paso, TX (US); Francisco Medina, El Paso, TX (US); David Espalin, El Paso, TX (US); Danny W. Muse, El Paso, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 559 days.

(21) Appl. No.: 13/343,651

(22) Filed: Jan. 4, 2012

(65) Prior Publication Data

US 2013/0170171 A1    Jul. 4, 2013

(51) Int. Cl.
*H05K 3/30* (2006.01)
*H05K 3/46* (2006.01)
(Continued)

(52) U.S. Cl.
CPC ............ *H01L 24/76* (2013.01); *B29C 64/106* (2017.08); *B29C 70/72* (2013.01); *B33Y 10/00* (2014.12);
(Continued)

(58) Field of Classification Search
CPC ........... Y10T 29/4913; Y10T 29/53174; Y10T 29/5313; Y10T 29/53196; Y10T 29/52;
(Continued)

(56) References Cited

U.S. PATENT DOCUMENTS

D269,984 S     8/1983  McKechnie
4,641,840 A    2/1987  Larson
(Continued)

FOREIGN PATENT DOCUMENTS

JP    2007018467 U    3/1995
JP    2002270422 A    9/2002
(Continued)

OTHER PUBLICATIONS

Espalin, David, et al., "Fused Deposition Modeling of Polymethylmethacrylate for Use in Patient-Specific Reconstructive Surgery," Rapid Prototyping Journal, vol. 16, Issue 3, (2010), 15 pages.

(Continued)

*Primary Examiner* — Peter Dungba Vo
*Assistant Examiner* — Kaying Kue
(74) *Attorney, Agent, or Firm* — Yee & Associates, P.C.

(57) ABSTRACT

The present invention provides a system and method for making a three-dimensional electronic, electromagnetic or electromechanical component/device by: (1) creating one or more layers of a three-dimensional substrate by depositing a substrate material in a layer-by-layer fashion, wherein the substrate includes a plurality of interconnection cavities and component cavities; (2) filling the interconnection cavities with a conductive material; and (3) placing one or more components in the component cavities.

14 Claims, 10 Drawing Sheets

(51) Int. Cl.
| | |
|---|---|
| *H01L 21/02* | (2006.01) |
| *H01L 23/00* | (2006.01) |
| *B33Y 10/00* | (2015.01) |
| *B33Y 70/00* | (2020.01) |
| *B33Y 80/00* | (2015.01) |
| *B29C 70/72* | (2006.01) |
| *H05K 1/18* | (2006.01) |
| *H01L 21/48* | (2006.01) |
| *B29C 64/106* | (2017.01) |
| *H05K 3/40* | (2006.01) |
| *H05K 1/02* | (2006.01) |
| *H05K 3/00* | (2006.01) |

(52) U.S. Cl.
CPC ............... *B33Y 70/00* (2014.12); *B33Y 80/00* (2014.12); *H01L 21/4846* (2013.01); *H01L 24/82* (2013.01); *H05K 1/183* (2013.01); *H05K 1/186* (2013.01); *H05K 3/4664* (2013.01); *B29C 2793/00* (2013.01); *H01L 21/486* (2013.01); *H01L 24/24* (2013.01); *H01L 24/32* (2013.01); *H01L 24/73* (2013.01); *H01L 24/75* (2013.01); *H01L 2224/24225* (2013.01); *H01L 2224/32225* (2013.01); *H01L 2224/73267* (2013.01); *H01L 2224/7525* (2013.01); *H01L 2224/7528* (2013.01); *H01L 2224/7565* (2013.01); *H01L 2224/75264* (2013.01); *H01L 2224/75901* (2013.01); *H01L 2924/12042* (2013.01); *H01L 2924/1301* (2013.01); *H01L 2924/14* (2013.01); *H01L 2924/1434* (2013.01); *H01L 2924/1461* (2013.01); *H01L 2924/157* (2013.01); *H01L 2924/1579* (2013.01); *H01L 2924/15153* (2013.01); *H01L 2924/15787* (2013.01); *H01L 2924/15788* (2013.01); *H05K 1/0272* (2013.01); *H05K 3/0044* (2013.01); *H05K 3/4069* (2013.01); *H05K 2203/0228* (2013.01); *H05K 2203/122* (2013.01); *Y10T 29/4913* (2015.01); *Y10T 29/53174* (2015.01)

(58) Field of Classification Search
CPC .......... H05K 3/30; H05K 3/32; H05K 3/4038; H05K 3/4061; H05K 3/4069; H05K 3/42; H05K 3/428; H05K 3/429; H05K 3/4664; H05K 3/0044; H05K 1/183; H05K 1/186; H05K 1/0272; H01L 24/76; H01L 24/82; H01L 21/4846; B29C 70/72; B29C 64/106
USPC .............................. 29/832–841; 361/807–812
See application file for complete search history.

(56) References Cited

U.S. PATENT DOCUMENTS

| | | | |
|---|---|---|---|
| 4,863,789 A | 9/1989 | Arai | |
| 5,096,532 A | 3/1992 | Neuwirth et al. | |
| 5,121,329 A | 6/1992 | Crump | |
| 5,656,905 A | 8/1997 | Tsai | |
| 5,694,680 A | 12/1997 | Yamada et al. | |
| 5,866,058 A * | 2/1999 | Batchelder | B29C 64/106 |
| | | | 264/237 |
| 5,866,441 A * | 2/1999 | Pace | H01L 21/485 |
| | | | 257/E21.511 |
| 5,903,041 A * | 5/1999 | La Fleur | H01L 21/7682 |
| | | | 257/209 |
| 6,153,034 A * | 11/2000 | Lipsker | B29C 41/36 |
| | | | 156/73.1 |
| 6,239,980 B1 * | 5/2001 | Fillion | H01L 23/5383 |
| | | | 361/760 |
| 6,297,551 B1 * | 10/2001 | Dudderar | H01L 23/055 |
| | | | 257/686 |
| 6,457,626 B1 | 10/2002 | Sheehan et al. | |
| 6,626,364 B2 | 9/2003 | Taban | |
| 6,698,089 B2 | 3/2004 | Finn et al. | |
| 7,419,630 B2 | 9/2008 | Palmer et al. | |
| 7,555,357 B2 | 6/2009 | Holzwarth | |
| 7,556,490 B2 | 7/2009 | Wicker et al. | |
| 7,658,603 B2 | 2/2010 | Medina et al. | |
| 7,910,041 B1 * | 3/2011 | Priedeman, Jr. | B29C 64/106 |
| | | | 264/319 |
| 7,959,874 B2 | 6/2011 | Kent et al. | |
| 8,123,224 B2 | 2/2012 | Deruyter | |
| 8,252,223 B2 | 8/2012 | Medina et al. | |
| 8,289,352 B2 * | 10/2012 | Vartanian | B41J 2/00 |
| | | | 250/505.1 |
| 9,126,365 B1 * | 9/2015 | Mark | B29C 48/0022 |
| 2003/0034554 A1 * | 2/2003 | Onitani | H01L 23/66 |
| | | | 257/705 |
| 2003/0036746 A1 * | 2/2003 | Penner | A61K 9/0009 |
| | | | 604/891.1 |
| 2003/0057544 A1 * | 3/2003 | Nathan | H05K 1/185 |
| | | | 257/700 |
| 2003/0075357 A1 * | 4/2003 | Ho | H01L 23/3121 |
| | | | 174/262 |
| 2004/0151978 A1 | 8/2004 | Huang | |
| 2005/0162644 A1 * | 7/2005 | Watanabe | G01N 21/95684 |
| | | | 356/237.1 |
| 2005/0164778 A1 | 7/2005 | Cooney | |
| 2005/0285312 A1 * | 12/2005 | Fury | B29C 39/006 |
| | | | 264/401 |
| 2006/0011486 A1 * | 1/2006 | Lockard | B81C 1/00492 |
| | | | 205/136 |
| 2007/0119617 A1 * | 5/2007 | Hayashi | H05K 1/186 |
| | | | 174/260 |
| 2007/0187137 A1 | 8/2007 | Isebo | |
| 2007/0232050 A1 * | 10/2007 | Toyama | H01L 23/66 |
| | | | 438/612 |
| 2008/0029872 A1 * | 2/2008 | Hsu | H01L 23/5389 |
| | | | 257/690 |
| 2008/0128865 A1 * | 6/2008 | Chia | H01L 23/49816 |
| | | | 257/620 |
| 2008/0129295 A1 * | 6/2008 | Carlton | G01R 33/341 |
| | | | 324/318 |
| 2008/0135282 A1 * | 6/2008 | Jonnalagadda | H05K 1/16 |
| | | | 174/260 |
| 2008/0199597 A1 * | 8/2008 | Huebler | H05K 1/16 |
| | | | 427/97.1 |
| 2008/0216887 A1 * | 9/2008 | Hacke | H01L 31/02244 |
| | | | 136/244 |
| 2008/0224293 A1 | 9/2008 | Hin | |
| 2008/0268942 A1 | 10/2008 | Deruyter | |
| 2008/0314626 A1 | 12/2008 | Moore | |
| 2009/0020919 A1 | 1/2009 | Marsac | |
| 2009/0210101 A1 | 8/2009 | Hawkins | |
| 2009/0267269 A1 * | 10/2009 | Lim | B29C 67/0059 |
| | | | 264/401 |
| 2009/0314650 A1 * | 12/2009 | Tseng | H01L 21/486 |
| | | | 205/205 |
| 2010/0055895 A1 | 3/2010 | Zafiropoulo et al. | |
| 2010/0058580 A1 | 3/2010 | Yasdani | |
| 2010/0126000 A1 * | 5/2010 | Forster | G06K 19/07718 |
| | | | 29/601 |
| 2010/0181105 A1 * | 7/2010 | Hitomi | H01L 21/481 |
| | | | 174/266 |
| 2010/0191360 A1 * | 7/2010 | Napadensky | G06T 17/00 |
| | | | 700/98 |
| 2010/0291304 A1 | 11/2010 | Becker | |
| 2011/0049558 A1 * | 3/2011 | Lin | H01L 33/486 |
| | | | 257/99 |
| 2011/0062575 A1 * | 3/2011 | Lin | H01L 23/13 |
| | | | 257/690 |
| 2011/0121476 A1 | 5/2011 | Batchelder et al. | |
| 2011/0166824 A1 * | 7/2011 | Haisty | G01B 5/12 |
| | | | 702/157 |
| 2012/0018924 A1 * | 1/2012 | Swanson | B33Y 10/00 |
| | | | 264/401 |

(56) References Cited

U.S. PATENT DOCUMENTS

| | | | |
|---|---|---|---|
| 2012/0231154 A1* | 9/2012 | Liao | H05K 3/1258 427/97.4 |
| 2012/0231225 A1* | 9/2012 | Mikulak | B29C 48/05 428/172 |
| 2013/0170171 A1* | 7/2013 | Wicker | H01L 21/4846 361/809 |
| 2013/0180450 A1 | 7/2013 | Hamilton et al. | |
| 2014/0268607 A1* | 9/2014 | Wicker | H05K 1/0284 361/761 |
| 2015/0077215 A1* | 3/2015 | Ranky | B29C 70/88 338/47 |

FOREIGN PATENT DOCUMENTS

| | | |
|---|---|---|
| JP | 2002532912 A | 10/2002 |
| JP | 2010219364 A | 9/2010 |
| KR | 1020110088644 A | 8/2011 |
| KR | 1020110134701 A | 12/2011 |
| WO | 2009093248 A1 | 7/2009 |
| WO | 2013103600 A4 | 7/2013 |

OTHER PUBLICATIONS

Lopes, Amit Joe, et al., , Emerald Article: Integrating Stereolithography and Direct Print Technologies for 3D Structural Electronics Fabrication, Rapid Prototyping Journal, (2012), vol. 18, Issue 2, pp. 129-143.

Lopes, Amit, et al., "Expanding Rapid Prototyping for Electronic Systems Integration of Arbitrary Form," 17th Annual Solid Freeform Fabrication Symposium, The University of Texas at Austin, Aug. 14-16, 2006, 12 pages.

Lopes, Amit, "Hybrid Manufacturing: Integrating Stereolithography and Direct Print Technologies," Ph.D. Dissertation, The University of Texas at El Paso, 2010, 128 pages.

Olivas, Richard, et al., "Structural Electronics Through Additive Manufacturing and Micro-Dispensing," IMAPS National Conference, Oct. 2010, 7 pages.

Roberson, David A., et al., "Microstructural and Process Characterization of Conductive Traces Printed from Ag Particulate Inks," Materials, (2011), vol. 4, pp. 963-979.

Zein, Iwan, et al., "Fused Deposition Modeling of Novel Scaffold Architectures for Tissue Engineering Applications," Biomaterial, (2002), vol. 23, pp. 1169-1185.

International Search Report and Written Opinion of KIPO for PCT/US2014/028206, dated Jun. 27, 2014, 10 pages.

International Search Report and Written Opinion of KIPO for PCT/US2014/028106, dated Jun. 27, 2014, 12 pages.

International Search Report and Written Opinion for PCT/US2012/072100 dated Apr. 26, 2013.

Ahn, et al. "Anisotropic material properties of fused deposition modeling ABS" Rapid Prototyping Journal (2002) 8 (4) pp. 248-257.

ASTM Standard F2792-12a. (2012). "Standard Terminology for Additive Manufacturing Technologies," ASTM International, West Conshohocken, PA.

Miettinen, et al. "Inkjet printed System-in-Package design and manufacturing" Microelectronics Journal, vol. 39, Issue 12, Dec. 2008, pp. 1740-1750.

Roberson, et al. "Ohmic curing of printed silver conductive traces." Journal of Electronic Materials (2012): 1-14.

* cited by examiner

EXTRUSION-BASED ADDITIVE MANUFACTURING SYSTEM FOR 3D STRUCTURAL ELECTRONIC, ELECTROMAGNETIC AND ELECTROMECHANICAL COMPONENTS/DEVICES

CROSS-REFERENCE TO RELATED APPLICATIONS

None.

TECHNICAL FIELD OF THE INVENTION

The present invention relates in general to the manufacture of electronic, electromagnetic and electromechanical components and devices, and more particularly to multiple material fabrication using an extrusion-based additive manufacturing system.

STATEMENT OF FEDERALLY FUNDED RESEARCH

None.

REFERENCE TO A SEQUENCE LISTING

None.

BACKGROUND OF THE INVENTION

Without limiting the scope of the invention, its background is described in connection with methods for manufacturing 3D objects and structures, more specifically 3D structural electronic, electromagnetic and electromechanical components and devices.

U.S. Pat. No. 5,121,329 issued to Crump (1992) discloses an apparatus incorporating a movable dispensing head provided with a supply of material which solidifies at a predetermined temperature, and a base member, which are moved relative to each other along "X," "Y," and "Z" axes in a predetermined pattern to create three-dimensional objects by building up material discharged from the dispensing head onto the base member at a controlled rate. The apparatus is preferably computer driven in a process utilizing computer aided design (CAD) and computer-aided manufacturing (CAM) software to generate drive signals for controlled movement of the dispensing head and base member as material is being dispensed. Three-dimensional objects may be produced by depositing repeated layers of solidifying material until the shape is formed. Any material, such as self-hardening waxes, thermoplastic resins, molten metals, two-part epoxies, foaming plastics, and glass, which adheres to the previous layer with an adequate bond upon solidification, may be utilized and considered suitable for the process. Each layer base is defined by the previous layer, and each layer thickness is defined and closely controlled by the height at which the tip of the dispensing head is positioned above the preceding layer.

SUMMARY OF THE INVENTION

The present invention describes an extrusion-based additive manufacturing system for 3D structural electronics that uses an innovative manufacturing process whereby multiple technologies are integrated into a single apparatus, device or machine to produce multi-material, heterogeneous, electronic structures exhibiting non-conventional component placement and sufficient mechanical properties.

The present invention provides a method for making a three-dimensional electronic, electromagnetic or electromechanical component/device by: (1) creating one or more layers of a three-dimensional substrate by depositing a substrate material in a layer-by-layer fashion, wherein the substrate includes a plurality of interconnection cavities and component cavities; (2) filling the interconnection cavities with a conductive material; and (3) placing one or more electronic components in the component cavities. The process can be repeated to create additional layers of the three-dimensional substrate. The present invention also provides a three-dimensional electronic, electromagnetic or electromechanical component/device made by the foregoing method.

In addition, the present invention provides a system for making a three-dimensional electronic, electromagnetic or electromechanical component/device that includes a three-dimensional printing device that creates one or more layers of a three-dimensional substrate by depositing a substrate material in a layer-by-layer fashion, wherein the substrate includes a plurality of interconnection cavities and component cavities. A first machine that fills the interconnection cavities with a conductive material. A component placement machine that places one or more components in the component cavities. The system may also include a slide, a conveyor or a robotic device that transports the three-dimensional substrate to each machine or sub-system.

Moreover, the present invention provides a three-dimensional electronic, electromagnetic or electromechanical component/device made by a method comprising the steps of (a) creating one or more layers of a three-dimensional substrate by depositing a substrate material in a layer-by-layer fashion, wherein the substrate includes a plurality of interconnection cavities and component cavities, (b) filling the interconnection cavities with a conductive material, and (c) placing one or more components in the component cavities.

BRIEF DESCRIPTION OF THE DRAWINGS

For a more complete understanding of the features and advantages of the present invention, reference is now made to the detailed description of the invention along with the accompanying figures and in which.

DETAILED DESCRIPTION OF THE INVENTION

Figure 1:
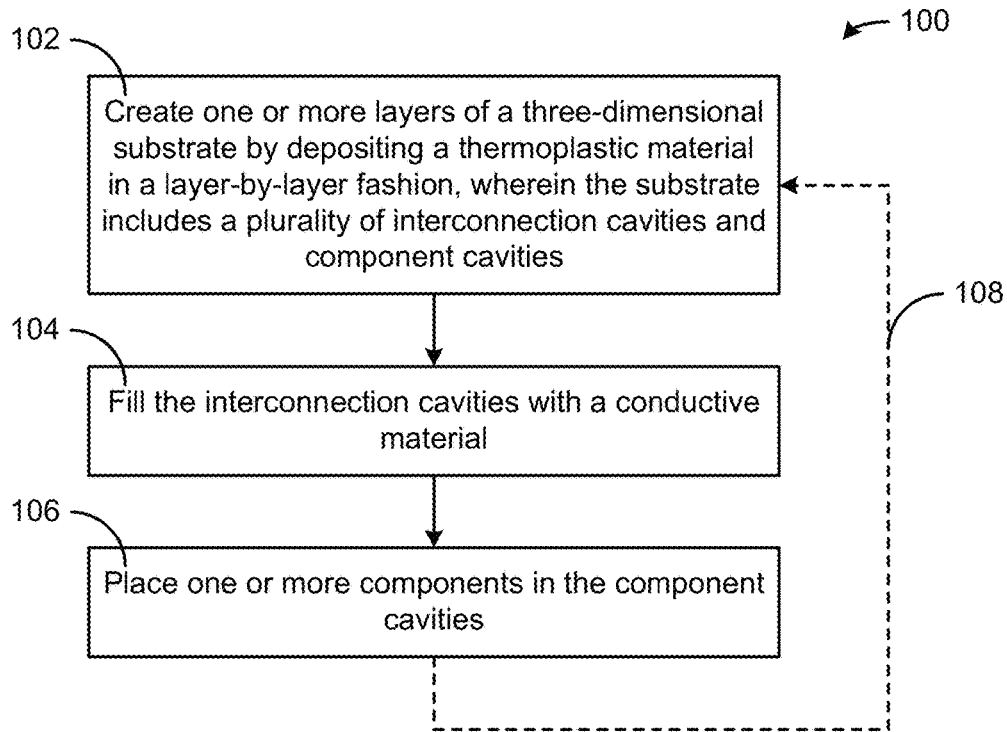
FIG. 1 is a flow chart of a method for making a three-dimensional electronic, electromagnetic or electromechanical component/device in accordance with one embodiment of the present invention.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an," and "the" are not intended to refer to only a singular entity, but include the general class of which a specific example may be used for illustration. The terminology herein is used to describe specific embodiments of the invention, but their usage does not delimit the invention, except as outlined in the claims.

One embodiment of the present invention provides an extrusion-based additive manufacturing system for 3D structural electronic, electromagnetic and electromechanical components/devices that utilizes fused deposition modeling (FDM), pick and place technology, computer numerical control (CNC) machining to develop an automated process that innovatively fabricates multi-material, heterogeneous, electronic, electromagnetic or electromechanical components/structures/devices without requiring assembly and exhibiting non-conventional component placement and sufficient mechanical properties and other material properties for the application. Some potentially relevant mechanical and material properties that may be required for the functional product may include impact resistance, elastic modulus, Poisson's ratio, flexural modulus and strength, tensile strength, creep, fatigue endurance, dielectric strength, dielectric constant, dissipation factor, thermal conductivity, deflection temperature, chemical resistivity, and water absorptivity. Additional processes can also be used as described below.

Access to individual layers while a 3D object is additively fabricated as described in the present invention allows for the integration of other complementary technologies to produce multi-material and multi-functional structures and devices. Additive Manufacturing (AM) has been used in a hybrid stereolithography (SL) and direct write (DW) system that successfully fabricated a LM 555 circuit [5, 6, 8, 9].

Fused deposition modeling (FDM) and direct-write, or direct print, technologies are used in the extrusion-based additive manufacturing system for fabricating 3D structural electronics, electromagnetic and electromechanical components/structures/devices. Electronic component placement in three-dimensions—different from the conventional planar placement in printed circuit board (PCB) arrangements—efficiently utilizes space and materials to satisfy mechanical and electrical design requirements of electronic, electromagnetic or electromechanical components/devices. Included in the new manufacturing process of the present invention is a subtractive manufacturing method (micro-machining) for the AM-fabricated substrate, which in the case of conventional FDM, is an extruded thermoplastic material. Tests conducted have proven the successful CNC micro-machining of interconnection channels as small as 230 µm. Laser ablation tests have also been performed and show greater resolutions which may not be possible with current CNC micro-machining Attributes of parts produced by this new invention are applicable in the electronics, electromechanical and biomedical industries.

Although widely used, electronic components housed on conventional PCB arrangements are not able to withstand more than minimal physical loads. In addition, mechanical and electrical designs are often conflicted as both cannot be realized with the planar layout that PCBs provide. The present invention, extrusion-based additive manufacturing system for 3D structural electronic, electromagnetic and electromechanical components/devices, addresses both these issues as: 1) parts are fabricated in a layered fashion wherein electronic components can be placed anywhere within a complex 3D part thus resulting in the simultaneous fulfillment of mechanical and electrical design requirements; and 2) parts can be designed and fabricated to possess multi-functions, such as the capability to provide impact resistance and substantial structural support by including stress reducing features (e.g., arches, trusses, filets, etc.) as well as intelligence through the integrated electronics, electromagnetic structures (e.g., gratings, transmission lines, filters, etc.) or electromechanical structures (e.g., actuators, gauges, mechanical sensors, etc.). Moreover, component and interconnection cavities do not require chemical cleansing as in the case of stereolithography wherein solvents are used to remove uncured photopolymer. This cleaning process is described in [4, 5, 6, 7, 8, 9, 10]. Residual photopolymer and solvent are both detrimental to the quality and reliability of electronic circuits.

One major drawback of a previously developed stereolithography/direct-write hybrid system with the capability of producing 3D electronic, electromagnetic and electromechanical components/devices is that the substrate material typically does not offer sufficient mechanical, thermal and electrical properties. Another limitation of prior systems is the 3D electronics are not impact resistant as parts tend to shatter when dropped. Moreover, the liquid resins used in stereolithography present problems during fabrication because the part and interconnection cavities have to be cleaned before components and conductive material can be embedded within the cavities. Further, once the components are inserted into the substrate and the conductive traces are added, the build may continue, causing the stereolithography liquid resin to possibly contaminate the inserted components and conductive traces, and require subsequent cleaning and removal of unreacted resin from the final part. These issues can negatively impact the reliability of the resulting components/devices. Conversely, the extrusion-based additive manufacturing system for 3D structural electronics uses a thermoplastic substrate to mitigate these deficiencies.

Manufacture of 3D structural electronics has proven difficult with conventional manufacturing methods. Additive manufacturing provides the unique opportunity to access individual layers if process interruption is achieved. The present invention allows the fused deposition modeling (FDM) process to be interrupted so that electronic components or thermal management components can be embedded. FDM technology has not been used for structural electronics due to the lack of resolution required for electronic circuitry. It is expected that, as the use of additive processes for 3D electronics fabrication grows, the requirements for higher component and trace density will also grow. FDM is unable to compete with traditional PCB technologies in terms of trace density. Furthermore, many of the latest integrated circuits have geometries (e.g., pin pitch) that require a resolution greater than can be achieved with current FDM technology. The present invention solves the FDM resolution issue by employing subtractive manufacturing methods that are intermittently used during the additive manufacturing process to provide high resolution and accurate features. These subtractive manufacturing processes may include a micro-machining machine, a CNC micro-machining machine, a micro electrical discharge machining machine, an electrochemical machining machine, a direct write proton micro-machining machine, a laser ablation machine, a radiative source, an ultrasonic cutting machine, a hot wire cutting machine, a waterjet machine, an etching machine, a deep reactive ion etching machine, a plasma etching machine, a crystal orientation dependent etching machine, a wet bulk micromachining machine, a UV-lithography or X-ray lithography (LIGA) machine, a hot embossing lithography machine, a precision mechanical sawing machine, a chemically assisted ion milling machine, a sand blasting machine, a cutting machine, or other suitable systems. CNC micromachining can achieve interconnection channels as small as 230 μm while laser micro-machining can be used to produce relatively smaller features.

The extrusion-based additive manufacturing system for 3D structural electronics addresses the limitations of the planar arrangement in a conventional PCB. Non-conventional placement of electronic components in a complex 3D part will enable the evolution of circuitry design. That is, parts will be limited by designs rather than manufacturing capabilities as is the current state-of-the-art. PCBs use a substrate that provides mechanical stability for component interconnections and require a housing to provide structural support for the entire electronic, electromagnetic or electromechanical component/device. The present invention provides components/devices with structural support without having to use a housing unless such a housing is desired.

The extrusion-based additive manufacturing system for 3D structural electronics has applications in the electronics industry as it promises to dramatically reduce manufacturing cost by, for example, eliminating the requirement of always having a housing to provide structural support. Government agencies, such as the Department of Defense, can use the present invention in a wide variety of applications including, but not limited to: 1) unmanned aerial systems (UASs) or unmanned aerial vehicles (UAVs) by providing aerodynamic parts with embedded sensors, communications and electronics within structural components or by directly fabricating onto UAS and UAV surfaces; 2) customized, mission-specific disposable electronics; 3) truly 3D antennas and photonic devices that improve communications; 4) replacement components for virtually any electronic system on a naval vessel; 5) custom fit sailor-borne electronics and communications systems; and 6) disposable floating depth-specific sensor systems. The invention can also be used in structural health monitoring, where 3D electronics are expected to play an important role in the future. This invention will allow real-time nondestructive monitoring of structural parts where sensors can be strategically placed in a complex part, which is very difficult to do with current manufacturing processes.

Now referring to FIG. 1, a flow chart of a method 100 for making a three-dimensional electronic, electromagnetic or electromechanical component/device in accordance with one embodiment of the present invention is shown. One or more layers of a three-dimensional substrate is/are created by depositing a substrate material in a layer-by-layer fashion in block 102. The substrate material may include a thermoplastic material as is typically used in FDM, or alternatively may include another polymer material, a ceramic material, a metallic material, a mineral material, a glass ceramic material, a semi-conductor material, a nanomaterial, a biomaterial, an organic material, an inorganic material, or any combination thereof. The substrate includes a plurality of interconnection cavities and component cavities. The thermoplastic material can be a material currently used commercially in FDM, such as acrylonitrile butadiene styrene (ABS), ABSi, ABSplus, ABS-M30, ABS-M30i, polycarbonate (PC), PC-ABS, PC-ISO, polyphenylsulfone (PPSF/PPSU), ULTEM 9085, or other material available from the FDM manufacturer; or alternatively, virtually any extrudable material such as poly(methyl methacrylate) (PMMA), polypropylene, polyolefin, LL-PE, HDPE, polyvinyl acetate, polyester, polyamides, nylon, polyimides, polyketone, polyether ethyl ketone (PEEK), polybutadiene, polylactic acid, polycaprolactone, polyethylene terephthalate, liquid crystalline polymer (LCP), polystyrene, polyvinyl chloride, polyfluoroethylene, polydifluoroethylene, polytetrafluoroethylene, ZEONEX RS420, Eccostock HIK-TPO, co-polymers and block co-polymers of the previous, or any other suitable material and any combination thereof. Moreover, the one or more layers can be deposited using a three-dimensional printing process, a fused deposition modeling process or other suitable process. The interconnection cavities may include an interconnection channel, a pin cavity and/or a via. The portion of the substrate can be removed using a micro-machining process, a laser ablation process or other suitable process. The interconnection cavities are filled with a conductive material in block 104. The conductive material can be a metal, a metal alloy, an ink containing conductive particles (e.g., silver particles), a conductive polymer, a wire or other suitable material. Note that filling the interconnections cavities can be done by inserting, placing or otherwise causing the conductive material (e.g., a liquid, a paste, a wire-bond, a filament, a solid, etc.) to be within the interconnection cavity. The interconnection cavities can be filled using a direct-write microdispensing process, a direct-print microdispensing process, a fused deposition modeling head, another extrusion-based deposition system, an inkjet dispensing system, a spray machine, a wire bonding machine, a solder machine, a photolithographic technique, an electrodeposition machine, a damascene process, a rotogravure machine, an electro sputtering machine or other suitable process. Additionally, the interconnection cavities may be filled by physically embedding electrical conductors. Subsequently, an ultrasonic staking machine may be used to secure the electrical conductor or components.

One or more components are placed (automatically, semi-automatically, manually, etc.) in the component cavities in block 106. The electronic components may include an electronic component (e.g., an integrated circuit, a resistor, a capacitor, an inductor, a transistor, a thermistor, a thyristor, a sensor, a processor, a memory, an interface device, a display, a power source, an energy conversion device or an antenna), an electrostatic component, a pneumatic component, an electroacoustic component, a microelectromechanical system (MEMS), a biomedical component, an electrochemical component, an electromechanical component, an electromagnetic component, a mechanical component, a metamaterial component, an optical component, a photonic component, a thermal component, a thermal management component, or any other desired component. The electronic components can be placed by hand or by using a component placement machine, such as a pick and place machine, a robotic process or other automated component placement technology. In some embodiments, the conductive material is cured. The conductive material can be cured using a laser, an Ohmic curing process, an inductive curing process, a radiation curing process, a thermal curing process, an electric polarization process or a magnetic polarization process or other suitable process. Several of these methods of curing are described in [8, 9, 10, 11] as examples. Moreover, the curing can be localized or directed to a specific conductive material rather than exposing the entire structure to the extremes necessary for the curing. Localized, high energy fluxes will also ensure an energy efficient process. Note that the curing step can be eliminated whenever a self-curing conductive material is used. As indicated by line 108, the process (blocks 102, 104 and/or 106) can be repeated to create additional layers of the three-dimensional substrate. The resulting three-dimensional substrate provides structural support for the electronic components, and may or may not require a housing for structural support. The three-dimensional substrate may include one or more arches, trusses, filets or other stress reducing features.

Figure 4A:
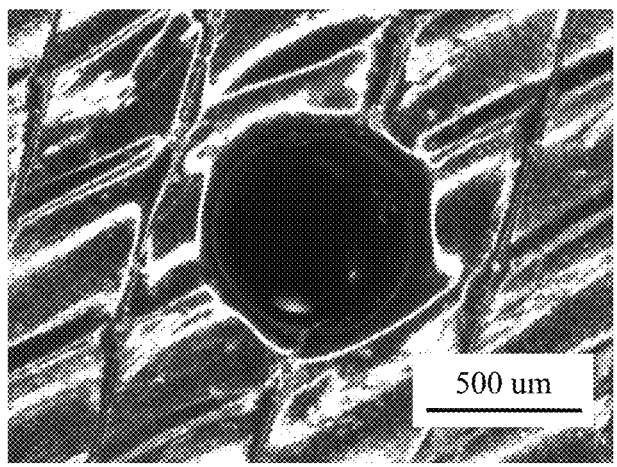
FIGS. 4A-4C show FDM-manufactured substrates with laser cut features demonstrating the feasibility of producing interconnection channels and component cavities with laser technologies in accordance with the present invention.
Figure 4B:
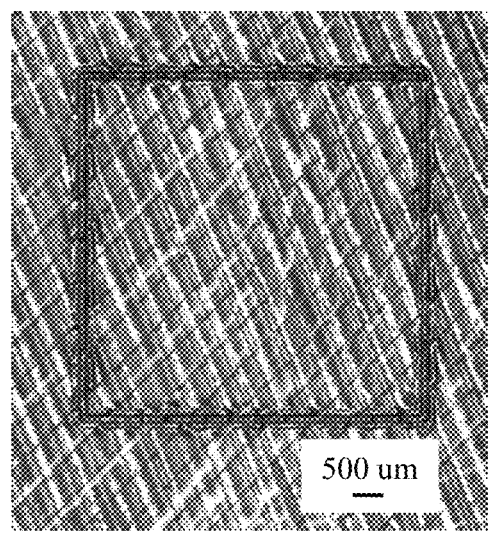
Figure 4C:
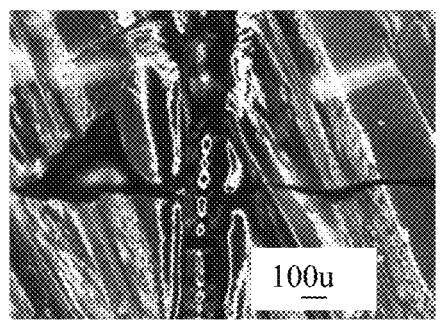
Figure 5:
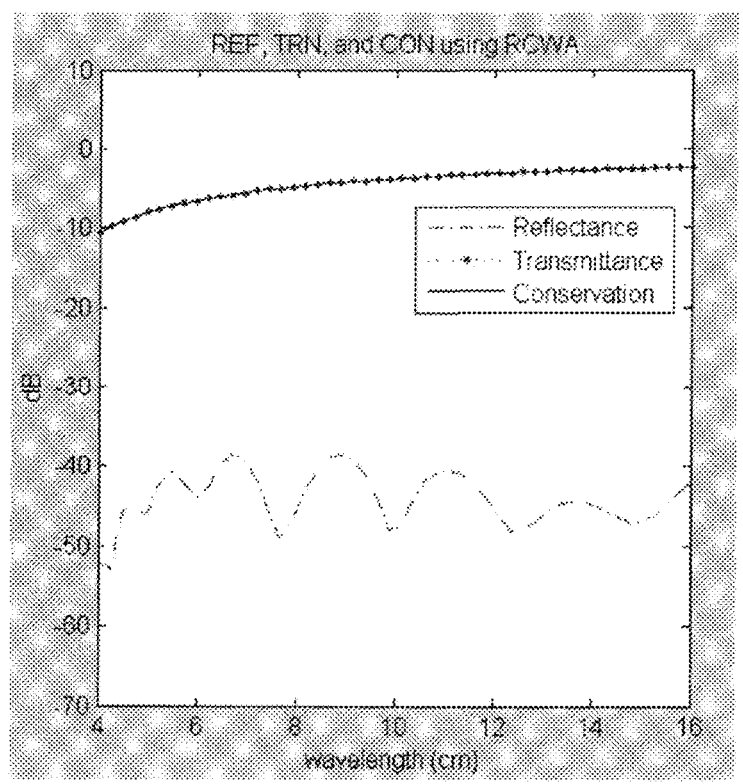
FIG. 5 shows a plot of the structure's performance in terms of electromagnetic reflectance, transmittance and conservation in accordance with various steps of the present invention.

The plurality of interconnection cavities and component cavities within the substrate can be created by removing a portion of the substrate using a micro-machining machine, a CNC micro-machining machine, a micro electrical discharge machining machine, an electrochemical machining machine, a direct write proton micro-machining machine, a laser ablation machine, a radiative source, an ultrasonic cutting machine, a hot wire cutting machine, a waterjet machine, an etching machine, a deep reactive ion etching machine, a plasma etching machine, a crystal orientation dependent etching machine, a wet bulk micromachining machine, a UV-lithography or X-ray lithography (LIGA) machine, a hot embossing lithography machine, a precision mechanical sawing machine, a chemically assisted ion milling machine, a sand blasting machine, a cutting machine, or other suitable systems. As an example, FIGS. 4A-4C show FSM-manufactured substrates with laser cut features demonstrating the feasibility of producing interconnection channels and component cavities with laser technologies. In addition, a portion of the substrate can be removed for a diffraction grating, an electromagnetically responsive structure, a cooling channel, a vent or any other desired structure. As an example, FIG. 5 show a plot of an example broadband anti-reflection grating's performance in terms of electromagnetic reflectance, transmittance and conservation. Moreover, the process may also include the step of depositing a thermally conductive material, a ceramic material, a dielectric material, and magnetic material, a piezoelectric material, an insulating material, an elastomer, a wax, as resin, an epoxy, a plastic material, a glass or any combination thereof on the substrate. The three-dimensional substrate can be transported to the various machines using a slide conveyor, a robotic, device or other suitable transport mechanism.

Figure 6A:
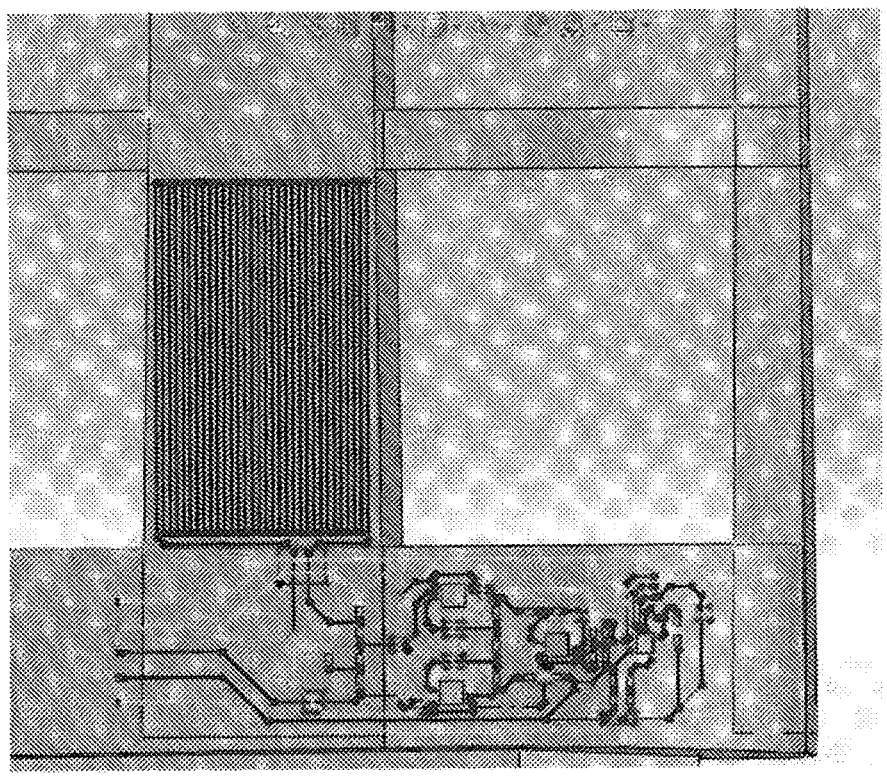
FIG. 6A shows a CAD model for a scaled UAV wing and FIG. 6B shows the scaled UAV wing fabricated with an FDM machine in accordance with various steps of the present invention.
Figure 6B:
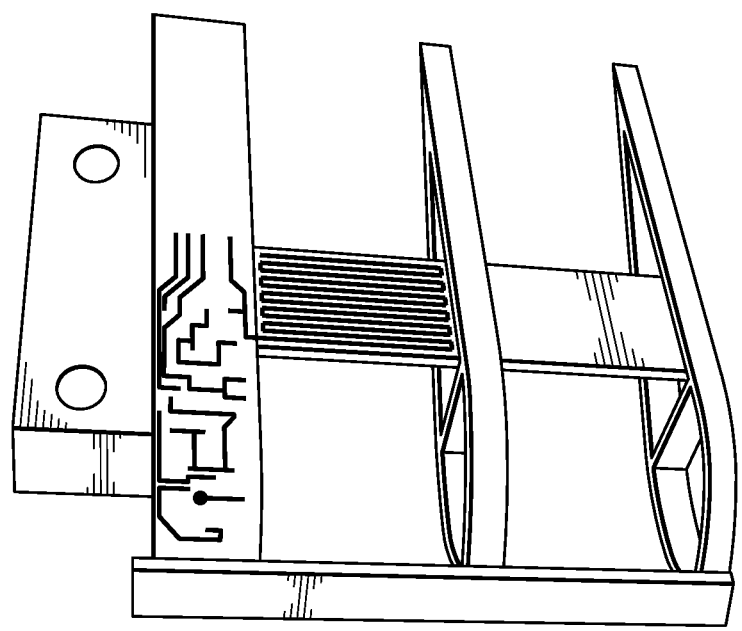

In another embodiment, cavities are not formed in the substrate. Instead, the components and/or conductive materials are deposited or inserted directly on a layer of the substrate material. One or more additional layers of substrate material are then deposited on top of the components and/or conductive materials. As an example, FIG. 6A shows a CAD model for a scaled UAV wing and FIG. 6B shows the scaled UAV wing as fabricated with an FDM machine. Cavities for several discrete components such as capacitors, resistors, inductors, and interconnection pins were designed with SolidWorks. As in [12], embedded electronic components were inserted into their respective cavities; however, the conductive inks were printed directly on the conformal substrate without the need for interconnection cavities.

Figure 2:
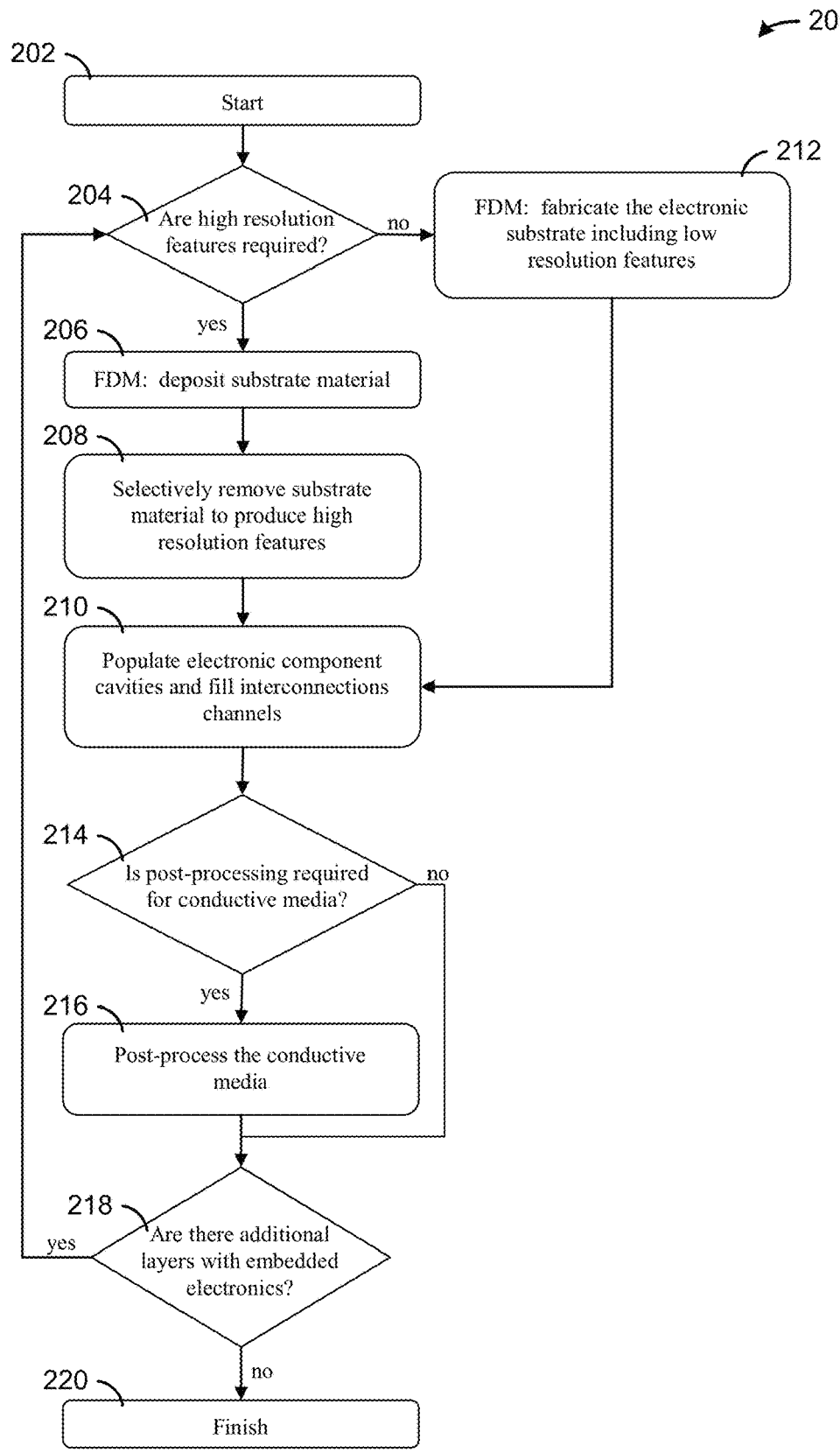
FIG. 2 is a flow chart of a method for making a three-dimensional electronic, electromagnetic or electromechanical component/device in accordance with another embodiment of the present invention.

Referring now to FIG. 2, a flow chart of method 200 for making a three-dimensional electronic, electromagnetic or electromechanical component/device in accordance with another embodiment of the present invention is shown. The process starts in block 202. If high resolution features are required, as determined in decision block 204, the substrate material is deposited using FDM in block 206, substrate material is selectively removed to produce high resolution features in block 208, and the electronic component cavities are populated and the interconnection channels are filled in block 210. If, however, high resolution features are not required, as determined in decision block 204, the electronic substrate including low resolution features is fabricated using FDM in block 212, and the electronic component cavities are populated and the interconnection channels are filled in block 210. If post-processing is required for conductive media, as determined in decision block 214, the conductive media is post-processed in block 216. Thereafter or if post-processing is not required for conductive media, as determined in decision block 214, the process repeats by looping back to decision block 204 whenever additional layers with embedded electronics are required, as determined in decision block 218. If, however, additional layers are not required, as determined in decision block 218, the process ends in block 220.

Figure 3:
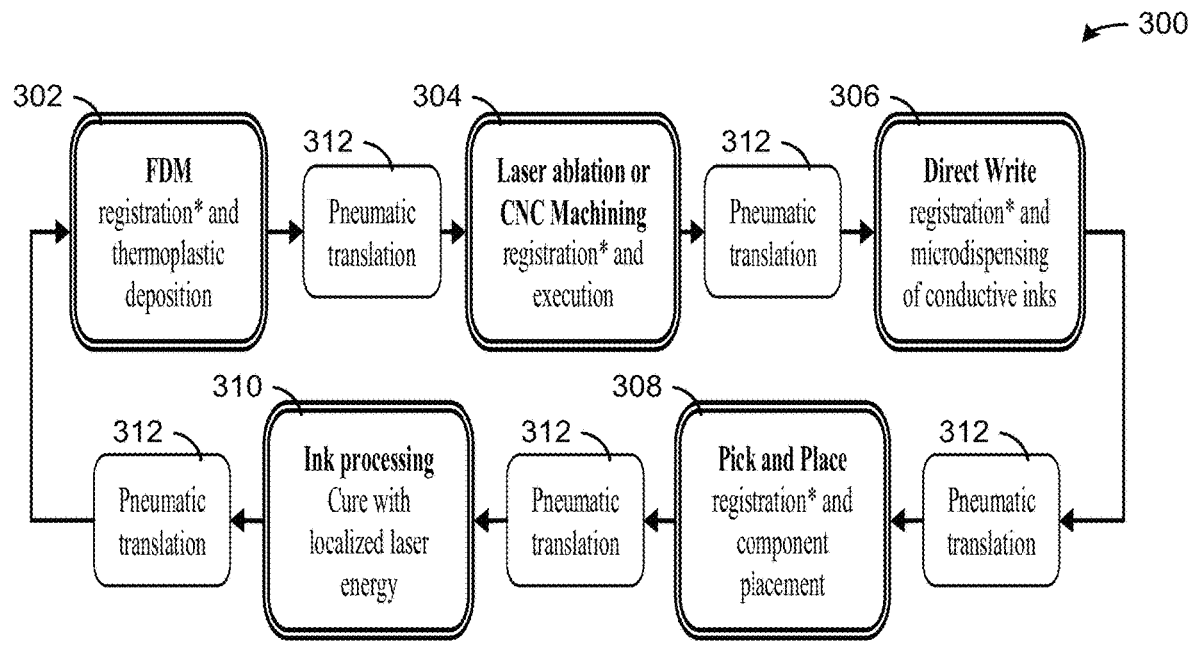
FIG. 3 is a flow chart of method for making a three-dimensional electronic, electromagnetic or electromechanical component/device in accordance with another embodiment of the present invention.

Now referring to FIG. 3, a flow chart of method 300 for making a three-dimensional electronic, electromagnetic or electromechanical component/device in accordance with another embodiment of the present invention is shown. The FDM phase 302 includes the step of depositing a substrate material (e.g., a thermoplastic material) in a layer-by-layer fashion to function as: 1) a substrate for conductive media; and 2) structural support for the device. Materials development studies have been conducted to adopt new thermoplastics (e.g., PMMA [13], polycaprolactone [14], polypropylene, ZEONEX RS420, Eccostock HIK-TPO) for the FDM process 302 that will enable the fabrication of devices whose attributes find applications in the electronic and biomedical industries. Some of these materials exhibit improved properties relevant to the application. As an example of a biomedical material, PMMA is used as a bone cement due to its relatively high tensile strength (60 MPa) and high softening temperature (125° C.). ZEONEX RS420 is an example of a substrate material for use in the electronic industry due to its low dielectric tangent loss (0.0002 at 1 MHz) and dielectric constant (2.3 at 1 MHz). After a specified number of layers have been deposited, a pneumatic stage 312 (or other transport mechanism) will transport the workpiece to the micro-machining phase 304. Between all phases, the pneumatic slide 312 is used to transport the work piece. The feature resolution achieved by FDM is not sufficient for electronic circuitry and therefore micro-machining 304—either by laser, CNC or other suitable process—is required. In the micromachining phase 304, the substrate is machined to produce features (e.g., FIGS. 7A and 7B) that include interconnection channels, component cavities, and vias or serve as a finishing process to achieve the required resolution and accuracy. Once machined, the workpiece is delivered to the DW phase 306 where conductive media (e.g., silver ink or other suitable material) is dispensed into the interconnection channels and pin locations. Electronic components (e.g., microprocessors, capacitors, resistors, etc.) are placed in their respective cavities by hand or by utilizing pick and place technology 308 or other similar automated component placement technology. One manufacturing cycle is completed with the processing of the conductive media. That is, the silver ink is cured with the use of a laser 310 or other suitable process. In addition, the silver particles within the ink are sintered by using laser energy. The manufacturing process 300 is repeated until a complete part, with embedded components, is produced. Note that machines may not be required to perform every portion of the manufacturing process 300.

Note that the previously described methods can be implemented using a computer program embodied on a non-transitory computer readable medium wherein the steps are performed using one or more code segments.

Figure 7A:
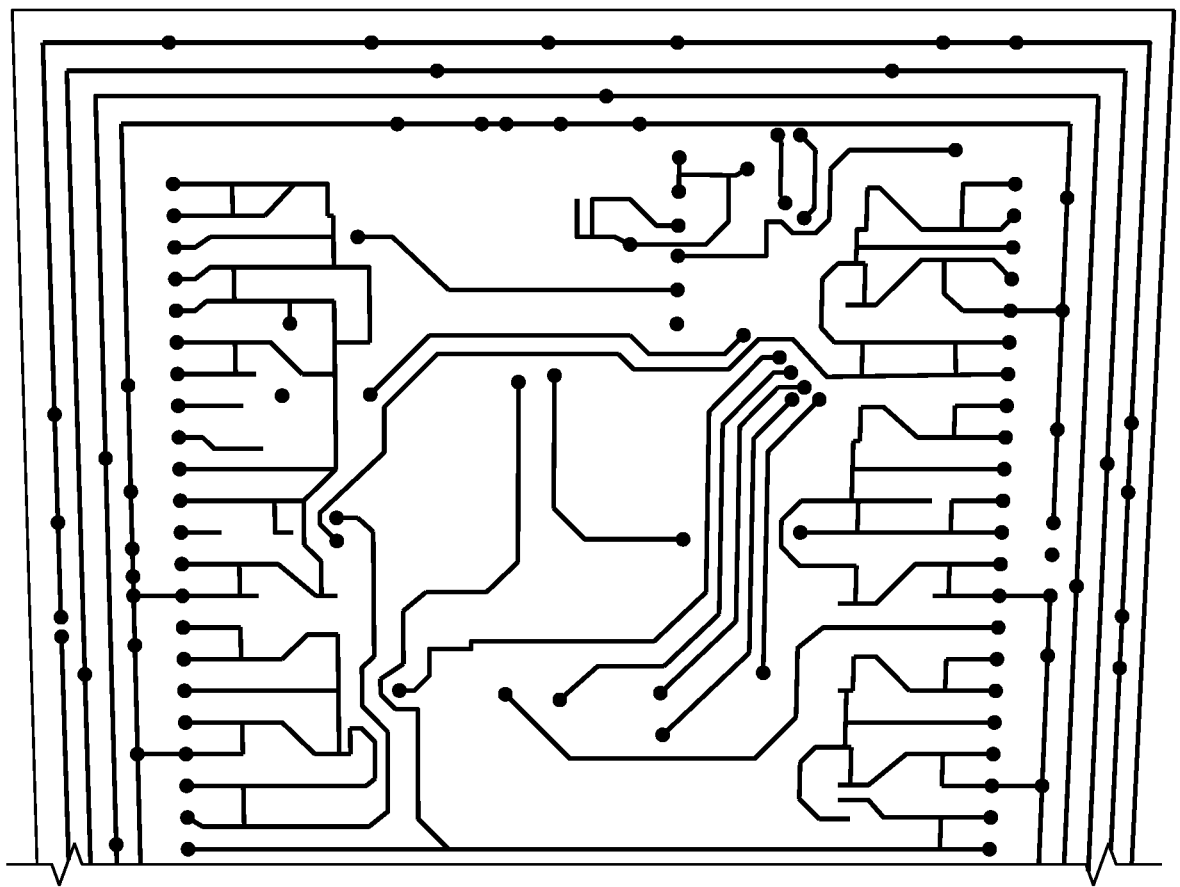
FIGS. 7A and 7B show a circuit part manufactured with the first two steps of the present invention.
Figure 7B:
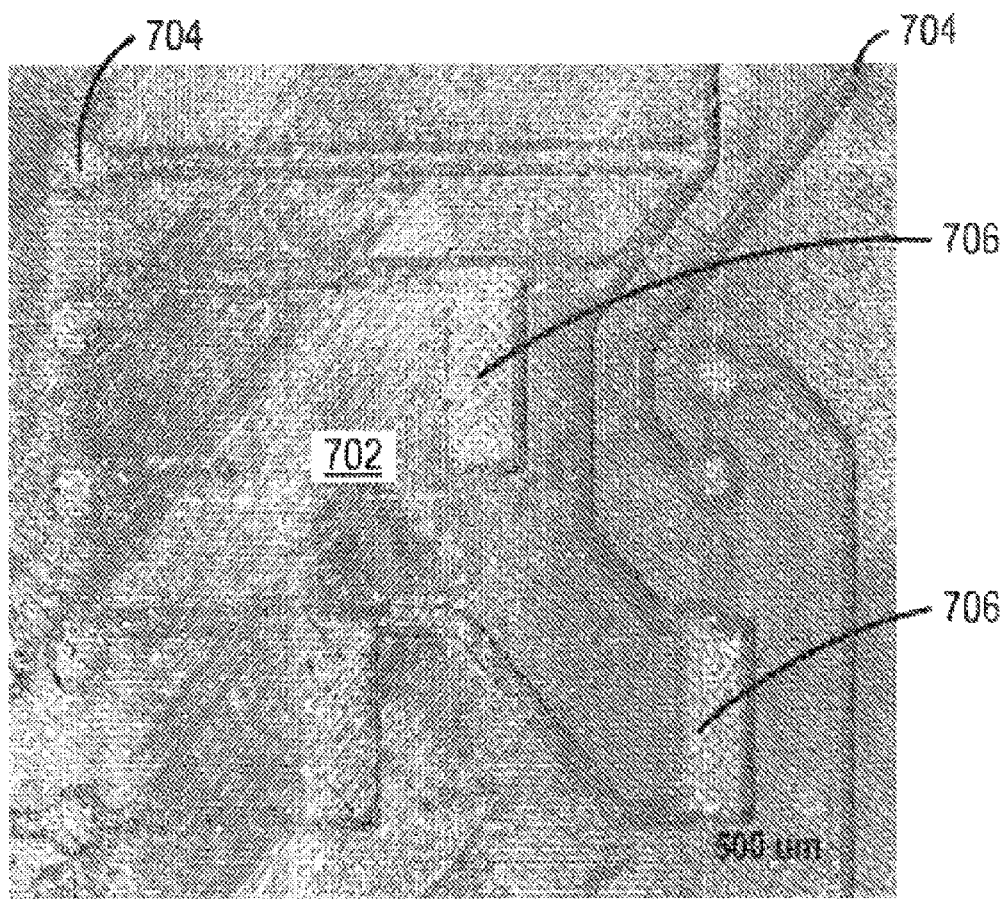

Referring now to FIGS. 7A and 7B, a circuit part 700 manufactured with the first two steps of the present invention is shown. More specifically, FIG. 7A is a photograph of the circuit part 700, and FIG. 7B is an enlarged portion of circuit part 700. The circuit part or three-dimensional electronic, electromagnetic or electromechanical component/device 700 includes a substrate 702 with a plurality of interconnection cavities 704 and electronic component cavities 706 within the substrate.

Figure 8:
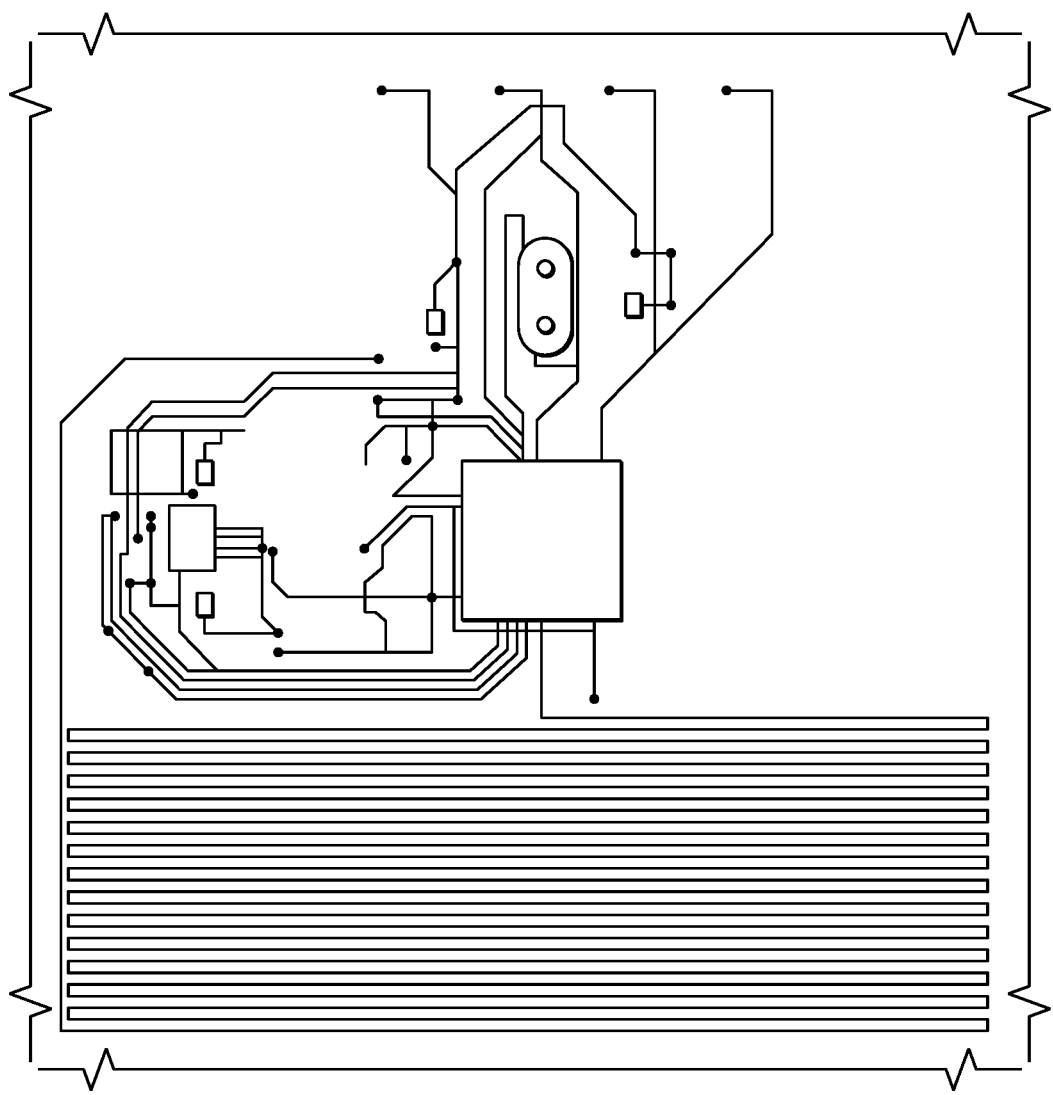
FIG. 8 shows a component/device manufactured using the method in accordance with one embodiment of the present invention.

Now referring to FIG. 8, a component/device manufactured using the method in accordance with one embodiment of the present invention is shown. This is a substrate that was machined with a CNC router, interconnection channels filled with conductive media, and electronic components have been placed into their corresponding cavities.

Figure 9A:
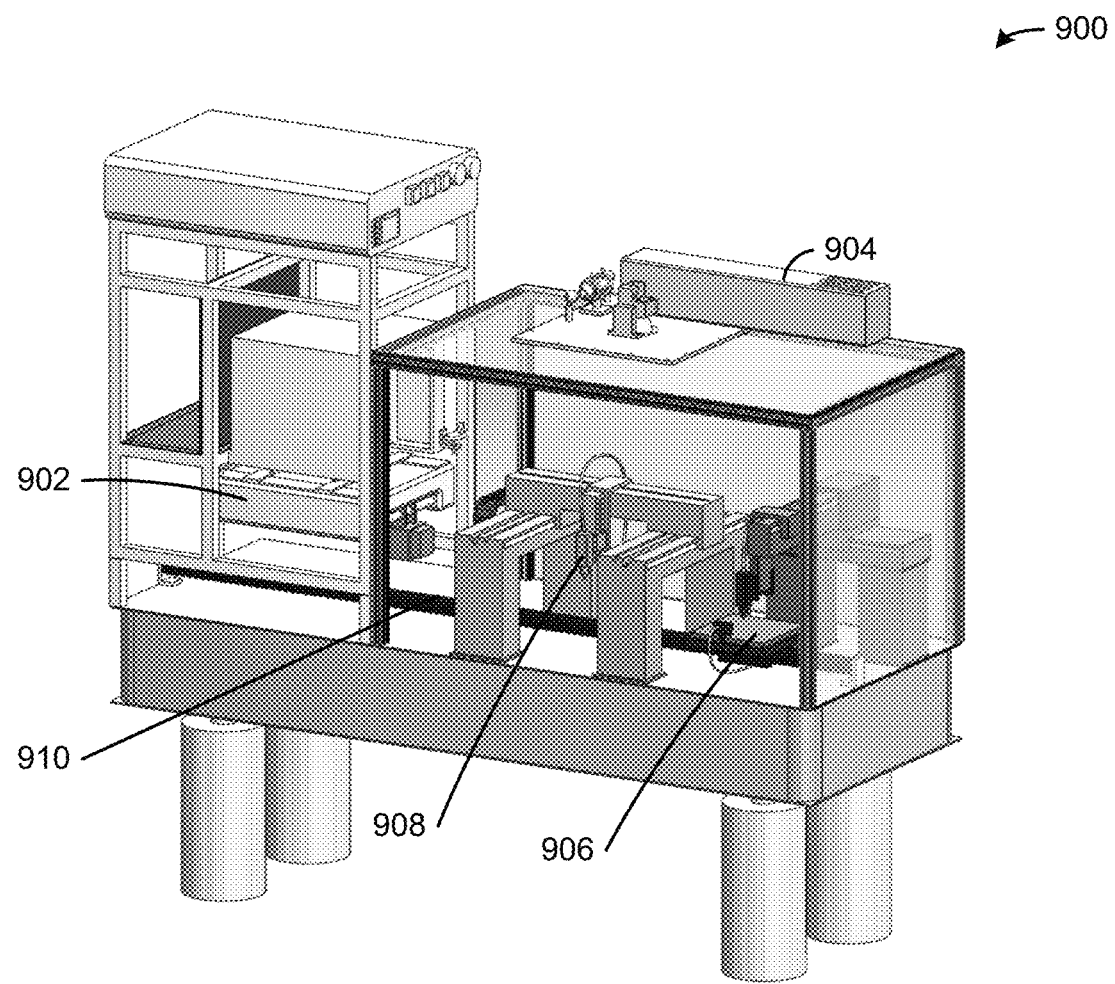
FIGS. 9A-9D show an example of an extrusion-based additive manufacturing system for 3D structural electronic, electromagnetic and electromechanical components/devices in accordance with the present invention.
Figure 9B:
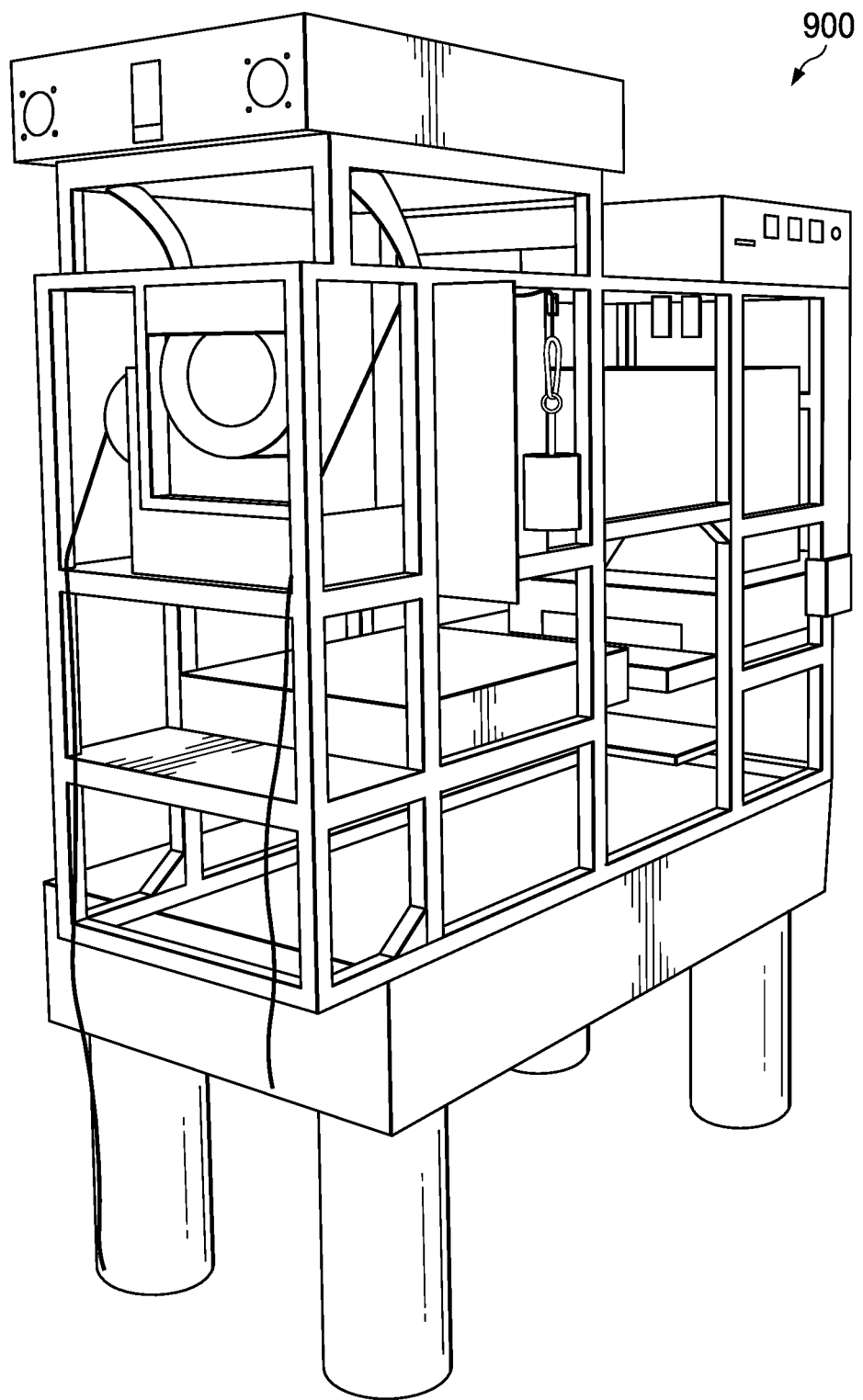
Figure 9C:
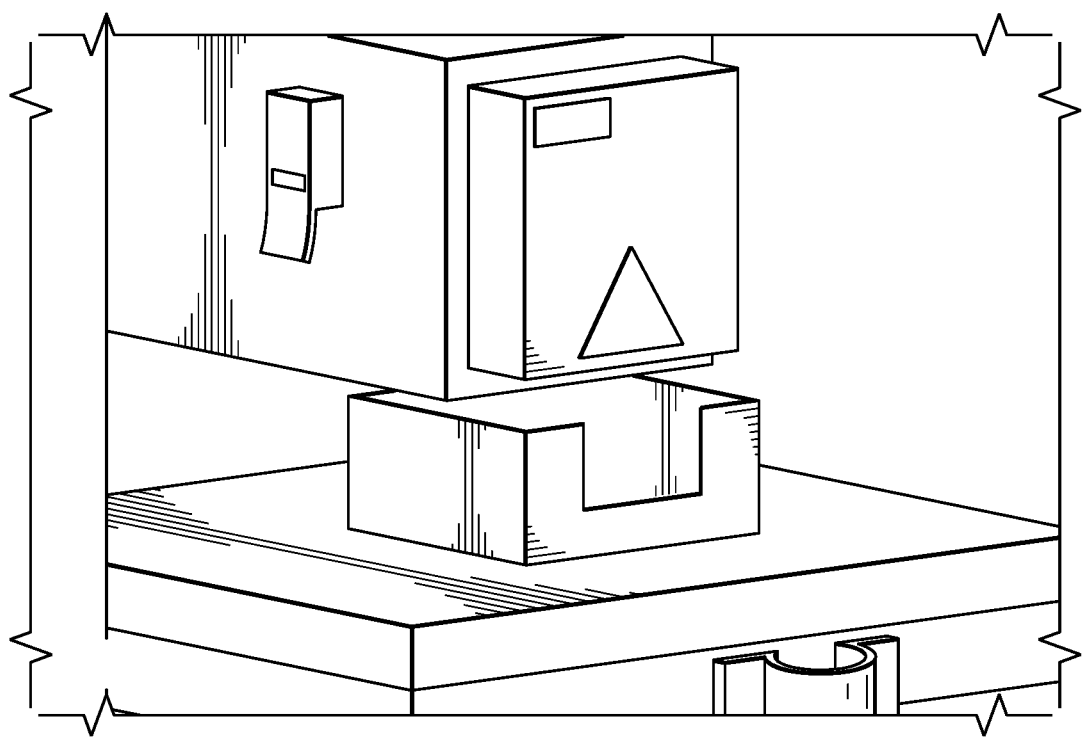
Figure 9D:
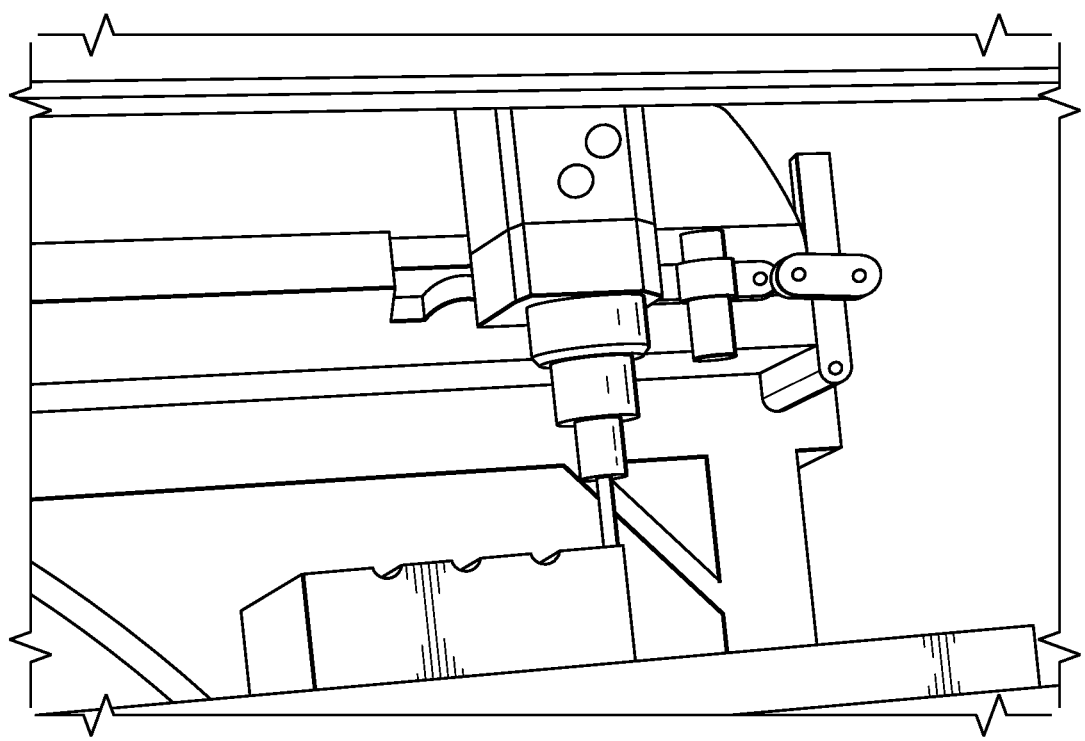

Referring now to FIGS. 9A-9D, an example of an extrusion-based additive manufacturing system 900 for 3D structural electronic, electromagnetic or electromechanical components/devices in accordance with the present invention is shown. More specifically, FIGS. 9A-9B shows a partially completed system 900, FIG. 9C shows a FDM tooling head, and FIG. 9D shows a DW microdispensing head. The system 900 for making a three-dimensional electronic, electromagnetic or electromechanical component/device includes a fused deposition modeling machine 902 that creates one or more layers of a three-dimensional substrate by depositing a substrate material in a layer-by-layer fashion, a micromachining machine or a laser ablation machine 904 that removes a portion of the substrate to form a plurality of interconnection cavities and electronic component cavities within the substrate, a direct-write or direct-print microdispensing machine 906 that fills the interconnection cavities with a conductive material, and a pick and place machine 908 that places one or more electronic components in the electronic component cavities. The laser 904 can also cure the conductive material. The system also includes a pneumatic slide 910 that transports the three-dimensional substrate to each machine or sub-system. All of the machines can be integrated into a single machine or similar manufacturing system or process.

As previously mentioned, parts produced by this invention will be used in various applications such as: 1) unmanned aerial systems (UASs) and unmanned aerial vehicles (UAVs) by providing aerodynamic parts with embedded sensors, communications and electronics within structural components or by directly fabricating onto UAS and UAV surfaces; 2) customized, mission-specific disposable electronics; 3) truly 3D antennas and photonic devices that improve communications; 4) replacement components for virtually any electronic system on a naval vessel; 5) custom fit sailor-borne electronics and communications systems; and 6) disposable floating depth-specific sensor systems; 7) biomedical devices; and 8) metamaterial structures.

It may be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications, patents and patent applications mentioned in the specification are indicative of the level of skill of those skilled in the art to which this invention pertains. All publications, patents and patent applications are herein incorporated by reference to the same extent as if each individual publication, patent or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, MB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it may be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES

1. U.S. Pat. No. 5,121,329: Apparatus and Method for Creating Three-Dimensional Objects.
2. U.S. Patent Application Publication No. 2011/0121476: Encoded Consumable Materials and Sensor Assemblies for Use in Additive Manufacturing Systems.
3. U.S. Pat. No. 7,555,357: Method for Building Three-Dimensional Objects with Extrusion-Based Layered Deposition Systems.
4. U.S. Pat. No. 7,556,490: Multi-Material Stereolithography.
5. U.S. Pat. No. 7,419,630: Methods and Systems for Rapid Prototyping of High Density Circuits.
6. U.S. Pat. No. 7,658,603: Methods and System for Integrating Fluid Dispensing Technology with Stereolithography.
7. U.S. Pat. No. 7,959,847: Methods for Multi-Material Stereolithography.
8. Lopes, A. J., MacDonald, E., Wicker, R., Integrating stereolithography and direct print technologies for 3D structural electronics fabrication. Rapid Prototyping Journal, Volume 18, Issue 2, 2012.
9. Lopes, A., Navarrete, M., Medina, F., Palmer, J., MacDonald, E., Wicker, R., (2006). Expanding rapid prototyping for electronic systems integration of arbitrary form. 17th Annual Solid Freeform Fabrication Symposium, University of Texas at Austin, August 14-16.
10. Amit Joe Lopes, "Hybrid manufacturing: Integrating stereolithography and direct print technologies," Ph.D. Dissertation, The University of Texas at El Paso, 2010, 128 pages.
11. D. A. Roberson, R. B. Wicker, L. E. Murr, K. Church, and E. MacDonald, "Microstructural and Process Characterization of Conductive Traces Printed from Ag Particulate Inks," Materials, Volume 4, Issue 6, 2011, pages 963-979.
12. Olivas, R., Salas, R., Muse, D., MacDonald, E., Wicker, R. Structural electronics through additive manufacturing and micro-dispensing. IMAPS National Conference, October 2010.
13. Espalin, D., Arcaute, K., Rodriguez, D., Medina, F., Posner, M., Wicker, R. Fused deposition modeling of patient-specific polymethylmethacrylate implants. Rapid Prototyping Journal, Volume 16, Issue 3, 2010.
14. Zein. I., Hutmacher, D. W., Tan, K. C., Teoh, S. H. Fused deposition modeling of novel scaffold architectures for tissue engineering applications. Biomaterials, Volume 23, Issue 4, 2002.

What is claimed is:

1. A method of making a three-dimensional device using a fused deposition modeling (FDM) three-dimensional printing device, comprising the steps of: creating a three-dimensional substrate comprising a plurality of layers by selectively depositing a thermoplastic substrate material in a layer-by-layer fashion using a FDM additive manufacturing system, wherein the plurality of layers is extruded from said FDM additive manufacturing system comprising a movable dispensing head that moves along a predetermined pattern to thereby produce each of the plurality of layers; intermittently pausing the FDM additive manufacturing system after a specified number of layers have been deposited, and then selectively removing portions of the substrate via micromachining to form a plurality of interconnection cavities therein, and a plurality of component cavities therein, wherein the plurality of interconnection cavities interconnect with at least some of a plurality of component cavities; filling the interconnection cavities with a conductive material; and placing one or more electrical components in the component cavities, the one or more electrical components contacting the conductive material in the interconnection cavities.

2. The method of claim 1, wherein the substrate material comprises at least one of a polymer material, a ceramic material, a metallic material, a mineral material, a glass ceramic material, a semi-conductor material, a nanomaterial, a biomaterial, an organic material, or any combination thereof.

3. The method of claim 1, wherein the substrate material further comprises acrylonitrile butadiene styrene (ABS), ABSi, ABSplus, ABS-M30, ABSM30i, PC-ABS, PC-ISO, polyphenylsulfone (PPSF/PPSU), or any combination thereof.

4. The method of claim 1, wherein the substrate material comprises at least one of poly(methyl methacrylate) (PMMA), polypropylene, polyolefin, 1LPE, HOPE, polyvinyl acetate, polyester, nylon, polyimides, polyketone, polyether ethyl ketone (PEEK), polybutadiene, polylactic acid, polycaprolactone, polyethylene terephthalate, liquid crystalline polymer (lCP), polystyrene, polyvinyl chloride, polyfluoroethylene, polydifluoroethylene, polytetrafluoroethylene, ZEONEX RS420, Eccostock HIK-TPO, co-polymers and block co-polymers of the previous, or any combination thereof.

5. The method of claim 1, further comprising the step of forming a cooling channel by removing a portion of the substrate.

6. The method of claim 1, further comprising the step of depositing at least one of a thermally conductive material, a ceramic material, a dielectric material, a magnetic material, a piezoelectric material, an insulating material, an elastomer, a wax, a resin, an epoxy, a plastic material, a glass or any combination thereof on the substrate.

7. The method of claim 1, wherein the interconnection cavities comprise at least one of an interconnection channel, a pin cavity or a via.

8. The method of claim 1, wherein the portions of the substrate are removed using at least one of a micro-machining machine, a CNC micro-machining machine, a micro electrical discharge machining machine, an electrochemical machining machine, a direct write proton micro-machining machine, a radiative source, an ultrasonic cutting machine, a hot wire cutting machine, a waterjet machine, an etching machine, a deep reactive ion etching machine, a crystal orientation dependent etching machine, a wet bulk micromachining machine, a UV-lithography or X-ray lithography (LIGA) machine, a hot embossing lithography machine, a precision mechanical sawing machine, a chemically assisted ion milling machine, a sand blasting machine, a cutting machine.

9. The method of claim 1, wherein the conductive material comprises at least one of a metal, a metal alloy, an ink containing conductive particles, a conductive polymer or a wire.

10. The method of claim 1, wherein the interconnection cavities are filled with the conductive material using at least one of a direct-write microdispensing process, a direct-print microdispensing process, a material extrusion additive manufacturing head, another extrusion-based deposition system, an inkjet dispensing system, a spray machine, a wire bonding machine, a solder machine, a photolithographic technique, an electrodeposition machine, a damascene process, a rotogravure machine, an electrosputtering machine or by a physical embedding process.

11. The method of claim 1, wherein the conductive material is cured using at least one of a laser, an Ohmic curing process, an inductive curing process, a radiation curing process, an electric polarization process or a magnetic polarization process.

12. The method of claim 1, wherein the electrical components comprise at least one of an electronic component, an electrostatic component, a pneumatic component, an electroacoustic component, a microelectromechanical system (MEMS), a biomedical component, an electrochemical component, an electromechanical component, an electromagnetic component, a mechanical component, a metamaterial component, an optical component, a photonic component, a thermal component or a thermal management component.

13. The method of 1, wherein the electrical components comprise at least one of an integrated circuit, a resistor, a capacitor, an inductor, a transistor, a them listor, a thyristor, a sensor, a processor, a memory, an interface device, a display, a power source, an energy conversion device or an antenna.

14. The method of claim 1, wherein the electrical components are placed by at least one of hand placement and using a component placement machine, wherein the component placement machine comprises at least one of a pick and place machine, a robotic process or other automated component placement technology.

* * * * *